(12) United States Patent
Wert (10) Patent No.: US 7,642,600 B1
(45) Date of Patent: Jan. 5, 2010

(54) SYSTEM AND METHOD FOR PROVIDING A LOW VOLTAGE THIN GATE INPUT/OUTPUT STRUCTURE WITH THICK GATE OVERVOLTAGE/BACKDRIVE PROTECTION

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 487 days.

(21) Appl. No.: 11/635,321

(22) Filed: Dec. 7, 2006

(51) Int. Cl.
*H01L 23/62* (2006.01)
(52) U.S. Cl. .............................. 257/355; 257/E29.012; 327/309
(58) Field of Classification Search ................ 257/355, 257/E29.012, E29.014; 327/309
See application file for complete search history.

(56) References Cited

U.S. PATENT DOCUMENTS

| | | | |
|---|---|---|---|
| 5,654,574 A * | 8/1997 | Williams et al. | 257/355 |
| 6,025,737 A * | 2/2000 | Patel et al. | 326/80 |
| 6,081,412 A | 6/2000 | Duncan et al. | |
| 6,501,318 B1 * | 12/2002 | Randazzo et al. | 327/309 |
| 7,046,036 B2 | 5/2006 | Chen et al. | |
| 2005/0168273 A1 | 8/2005 | Chen | |
| 2005/0184788 A1 | 8/2005 | Johansson et al. | |
| 2006/0091917 A1 | 5/2006 | Li et al. | |

OTHER PUBLICATIONS

Rick Merritt, "Mobile Chip Interface Gets Real. MIPI Group Gains Traction in Push Toward Standard Serial Links For Cell Phone ICs," EETimes Online, http://www.eetimes.com/latest/showArticle. jhtml?articleID=179102751&printable=true (1 of 3) Oct. 3, 2006.

* cited by examiner

*Primary Examiner*—Jerome Jackson, Jr.
*Assistant Examiner*—Paul A Budd (57) ABSTRACT

A system and method are disclosed for providing an integrated circuit low voltage thin gate input/output structure with thick gate overvoltage/backdrive protection. In an advantageous embodiment of the present invention, a transfer gate of the input/output structure comprises at least one thick gate native (or depletion) n-channel metal oxide semiconductor (NMOS) transistor that is connected to an output pad node of the input/output structure. The thick gate native (or depletion) NMOS transistor prevents current from the output pad node from entering the input/output structure when a voltage level of the output pad node is high.

21 Claims, 6 Drawing Sheets

SYSTEM AND METHOD FOR PROVIDING A LOW VOLTAGE THIN GATE INPUT/OUTPUT STRUCTURE WITH THICK GATE OVERVOLTAGE/BACKDRIVE PROTECTION

TECHNICAL FIELD OF THE INVENTION

The present invention is generally directed to the manufacture of integrated circuits and, in particular, to providing a low voltage, thin gate input/output structure with thick gate overvoltage/backdrive protection.

BACKGROUND OF THE INVENTION

In the manufacture of integrated circuits it is desirable to provide overvoltage/backdrive protection for input/output structures. It is desirable to provide an overvoltage/backdrive protection circuit that is capable of preventing reverse charge leakage and gate oxide breakdown when the voltage on an input/output structure exceeds an internal power supply voltage or when the input/output structure is powered down.

The term "backdrive" refers to a condition that may occur when a device that is powered down is connected to a bus to which other devices are also connected. When one of the other devices is powered up and begins driving the bus, the device that is powered down may receive a "backdrive" voltage signal from the bus.

Different types of Metal Oxide Semiconductor (MOS) transistors can be fabricated and used in electronic circuits. For example, thick gate transistors and thin gate transistors can be used in electronic circuits, where the thick gate transistors and the thin gate transistors have gate oxide layers of different thicknesses. The term "thin gate transistor" refers to a transistor that has a gate thickness of ninety Ångstroms (90 Å) or less. The term "thick gate transistor" refers to a transistor that has a gate thickness of one hundred ten Ångstroms (110 Å) or more. In one advantageous embodiment, the thin gate transistors have a gate thickness of about seventy Ångstroms (70 Å) and the thick gate transistors have a gate thickness of about one hundred thirty Ångstroms (130 Å).

For another example, standard, native, and depletion n-channel MOS (NMOS) transistors can be used in electronic circuits. A standard NMOS transistor is typically formed within a p-well, a native NMOS transistor is typically formed directly on a semiconductor substrate, and a depletion NMOS transistor is typically formed within a p-well that has a special depletion implant in the gate region of the transistor.

The different types of transistors typically have different operating characteristics. For example, a gate to source voltage ($V_{GS}$) that is equal to (or nearly equal to) zero volts may be needed to turn off a thick-gate standard NMOS transistor. A gate to source voltage that is equal to a negative three hundred fifty millivolts (−350 mV) may be needed to turn off a thick gate native NMOS transistor. A gate to source voltage that is equal to a negative five hundred millivolts (−500 mV) to a negative six hundred millivolts (−600 mV) may be needed to turn off a thick gate depletion NMOS transistor. A gate to source voltage that is equal to a negative two hundred millivolts (−200 mV) may be needed to turn off a thin gate standard NMOS transistor.

In certain electronic circuits, this means that native and depletion NMOS transistors cannot be turned completely off, such as when a source voltage rail ($V_{DD}$) is one and eight tenths volts (1.8 V) and a ground voltage rail ($V_{SS}$) is zero volts (0.0 V). The inability to completely turn off native and depletion NMOS transistors often prevents the native and depletion NMOS transistors from being used in standard logic gates and other circuits.

The specifications for an input/output structure of an exemplary bus structure require an output voltage range of one volt (1.0 V) to one and one half volt (1.5 V). This requirement gives rise to problems in providing robust electrostatic discharge (ESD) performance and acceptable alternating current (ac) performance. In order to achieve good ESD performance it is desirable to allow only thick gate transistors to touch the output pad of the input/output structure.

A major problem with this approach is that at room temperature (about twenty three degrees Celsius (23° C.)) the threshold voltage (Vth) for a thick gate PMOS transistor is typically nine tenths of a volt (0.9 V). As the temperature drops to about minus forty degrees Celsius (−40° C.), the threshold voltage (Vth) will climb to about one and one tenth volt (1.1 V). This means that the amount of overdrive voltage of a PMOS transistor (i.e., the gate to source voltage ($V_{GS}$) minus the threshold voltage (Vth)) becomes very small.

For example, at minus forty degrees Celsius (−40° C.), the overdrive voltage of a PMOS transistor can be as little as one tenth of a volt (0.1 V). This is because the ground to source voltage $V_{GS}$ is one and two tenths volt (1.2 V) and the threshold voltage (Vth) is one and one tenth volt (1.1 V). The difference (1.2 V−1.1 V) is one tenth of a volt (0.1 V). Therefore, the ability of a PMOS transistor to provide a sufficient drive is severely limited.

One method for avoiding this result would be to have a second voltage on board the input/output structure. The second voltage could have a value of two and one half volts (2.5 V) or three and three tenths volt (3.3 V). The second voltage could be used in the output PMOS transistor. This approach requires special level shifters to transform the core voltage range of one and one half volt (1.5 V) (or one and two tenths volt (1.2 V)) down to zero volts (0.0 V) into a larger range of two and five tenths volts (2.5 V) (or three and three tenths volt (3.3 V)) down to zero volts (0.0 V).

There are several drawbacks with this method. First, the special lever shifters will limit the alternating current (ac) performance of the input/output structure. Second, a second voltage will have to be provided. Third, the input side of the input/output structure still must operate with a gate to source voltage ($V_{GS}$) of one and two tenths volt (1.2 V) or one and five tenths volt (1.5 V). These drawbacks could be overcome with specially designed linear input/output structures that draw ac current. However, this would provide an undesirable increase in the amount of current consumption in the input/output structure.

Figure 1:
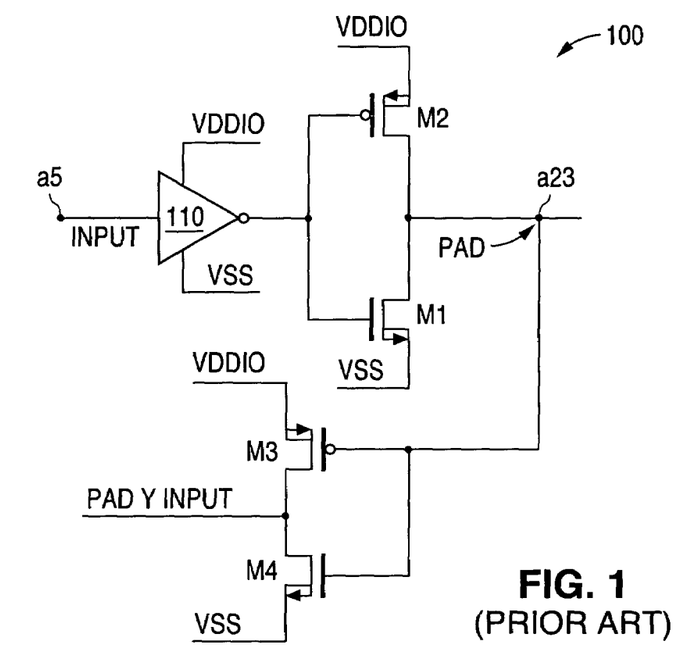
FIG. 1 illustrates a schematic circuit diagram of a first prior art input/output structure.

FIG. 1 illustrates a schematic circuit diagram of a first prior art input/output structure 100. As shown in FIG. 1, input/output structure 100 comprises four thick gate transistor devices (M1, M2, M3, M4). The drain of thick gate NMOS transistor M1 and the drain of thick gate PMOS transistor M2 are connected to the PAD node (also designated as node "a23"). The source and body of thick gate PMOS transistor M2 are connected to the external supply voltage VDDIO and the source and body of thick gate NMOS transistor M1 are connected to the ground voltage VSS. The gate of thick gate NMOS transistor M1 and the gate of thick gate PMOS transistor M2 are connected to the output of an inverter 110. The inverter 110 provides an inverted version of the input signal to the gate of the thick gate NMOS transistor M1 and to the gate of the thick gate PMOS transistor M2. The input of inverter circuit 110 is connected to an input node "a5" (designated with the word INPUT in FIG. 1).

As also shown in FIG. 1, the gate of thick gate PMOS transistor M3 and the gate of thick gate NMOS transistor M4 are connected to the PAD node. The source and the body of the thick gate PMOS transistor M3 are connected to the external supply voltage VDDIO. The source and the body of the thick gate NMOS transistor M4 are connected to the ground voltage VSS. The drain of thick gate PMOS transistor M3 and the drain of thick gate NMOS transistor M4 are both connected to the PAD Y INPUT.

One major drawback of the prior art input/output structure 100 shown in FIG. 1 is that the switching transistors (M1 and M2) are both thick gate devices. This means that the P channel device (PMOS transistor M2) has a room temperature threshold voltage (Vth) of approximately eight tenths of a volt (0.8 V). At low temperatures the threshold voltage will be even larger (perhaps as much as one volt (1.0 V)).

This means that at a low temperature and a low voltage the overdrive of the P channel device (PMOS transistor M2) would be small and the alternating current (ac) performance would be poor. At low values of the external supply voltage VDDIO, the performance of the thick gate input/output structure 100 becomes compromised and performs very poorly.

In order to compensate for the poor performance at low temperature and low voltage, the sizes of the switching transistors (M1 and M2) may have to be increased to very large sizes—perhaps to twenty (20) or thirty (30) times the size of thin gate MOS devices driving the same conditions.

Figure 2:
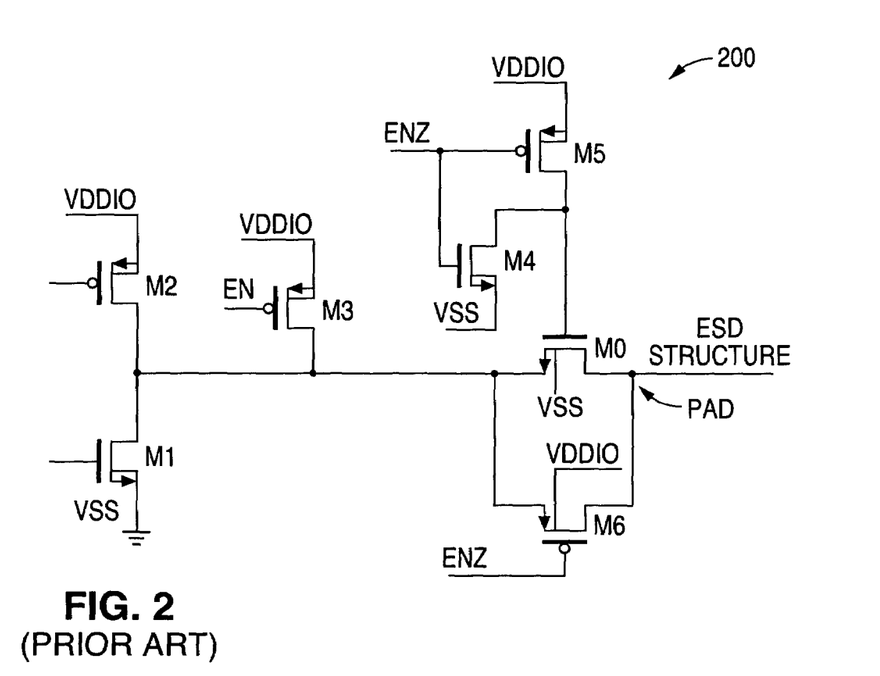
FIG. 2 illustrates a schematic circuit diagram of a second prior art input/output structure.

FIG. 2 illustrates a schematic circuit diagram of a second prior art input/output structure 200. As shown in FIG. 2, there are only two transistors (NMOS transistor M0 and PMOS transistor M6) that touch the PAD node. The PAD node is coupled to an electrostatic discharge (ESD) structure (not shown in FIG. 2). The NMOS transistor M0 and the PMOS transistor M6 are both thick gate transistors. The remaining transistors (M1, M2, M3, M4, M5) are thin gate transistors. The thick gate transistors (M0, M6) form the transfer gate of input/output structure 200.

The drain of NMOS transistor M0 and the drain of PMOS transistor M6 are both connected to the PAD node. The body of NMOS transistor M0 is connected to the ground voltage VSS. The body of PMOS transistor M6 is connected to the external power supply voltage VDDIO. The source of NMOS transistor M0 and the source of PMOS transistor M6 are both connected to the drain of PMOS transistor M2 and to the drain of NMOS transistor M1. The source and body of PMOS transistor M2 are connected to the external power supply VDDIO. The source and body of NMOS transistor M1 are connected to the ground voltage VSS. The gate of NMOS transistor M1 and the gate of PMOS transistor M2 are connected to control signals that appropriately turn transistors M1 and M2 on and off.

The gate of PMOS transistor M6 is connected to an inverted version (ENZ) of the enable signal (EN). The inverted version (ENZ) of the enable signal (EN) is the signal that is used to enable the output driver. The gate of NMOS transistor M0 is connected to the drain of NMOS transistor M4 and to the drain of PMOS transistor M5. As shown in FIG. 2, the gate of NMOS transistor M4 and the gate of PMOS transistor M5 are coupled to the inverted version (ENZ) of the enable signal (EN). The source and body of NMOS transistor M4 are connected to the ground voltage VSS and the source and body of the PMOS transistor M5 are connected to the external supply voltage VDDIO.

Transistor M3 is a PMOS transistor that has its gate coupled to the enable signal (EN) and its source and body connected to the external supply voltage VDDIO. The thin gate output driver is enabled when the enable signal (EN) is high. The drain of PMOS transistor M3 is connected to the source of NMOS transistor M0 and to the source of PMOS transistor M6 and to the drain of PMOS transistor M2 and to the drain of NMOS transistor M1.

The second prior art structure 200 shown in FIG. 2 provides a thin gate transistor output driver in which only thick gate transistor devices (M0, M6) are in contact with the PAD node. The threshold voltage (Vth) for a thin gate PMOS transistor is approximately one half volt (0.5 V). The threshold voltage (Vth) for a thin gate NMOS transistor is approximately four tenths of a volt (0.4 V). This means that the thin gate transistors can provide a reasonable performance level.

One drawback of the prior art input/output structure 200 is that there is a problem with charge leakage from the PAD node when the temperature reaches one hundred twenty five degrees Celsius (125° C.). Another drawback of the prior art input/output structure 200 is that if the output is active (and the transfer gate (M0, M6) is enabled) and an electrostatic discharge (ESD) event occurs, the ESD event will likely go straight to the thin gate transistors and cause them to fail. In addition, there are two thick gate transistor devices (transfer gate transistors (M0,M6)) in the ac path. Even though the transfer gate transistors (M0, M6) are enabled and may not switch in an ac mode, the overdrive of these two devices would be very small. This would require the size of the transistor M1 and the size of transistor M2 and the size of the transfer gate transistors (M0, M6) to be very large (assuming that they can be made large enough to perform their required functions).

Therefore, there is a need in the art for an improved system and method of providing overvoltage/backdrive protection for an input/output structure. In particular, there is a need in the art for an improved system and method for providing a low voltage, thin gate input/output structure with thick gate overvoltage/backdrive protection.

The present invention provides an improved system and method for providing overvoltage/backdrive protection for an input/output structure. In one advantageous embodiment of the present invention, a transfer gate of the input/output structure comprises a thick gate native or depletion n-channel metal oxide semiconductor (NMOS) transistor that is connected to an output pad node of the input/output structure. The thick gate native or depletion NMOS transistor prevents current from the output pad node from entering the input/output structure when the voltage level at the output pad node is high.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 3 through 11, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged input/output structure for an integrated circuit.

There are several advantages to be gained if one replaces the transfer gate of an input/output structure with a thick gate native n-channel metal oxide semiconductor (NMOS) transistor. A native NMOS transistor has a threshold voltage (Vth) of approximately a negative one tenth volt (−0.1 V). If the native NMOS transistor is implemented as a thick gate transistor, it is possible to limit the voltage that may be pushed through the native NMOS transistor to a voltage that is equal to approximately three tenths of a volt (0.3 V) plus the external supply voltage VDDIO (i.e., 0.3 V+VDDIO). Because a native NMOS transistor has such a low threshold voltage (e.g., about minus one tenth volt (−0.1 V)) no p-channel metal oxide semiconductor (PMOS) transistor is required on the input.

Figure 3:
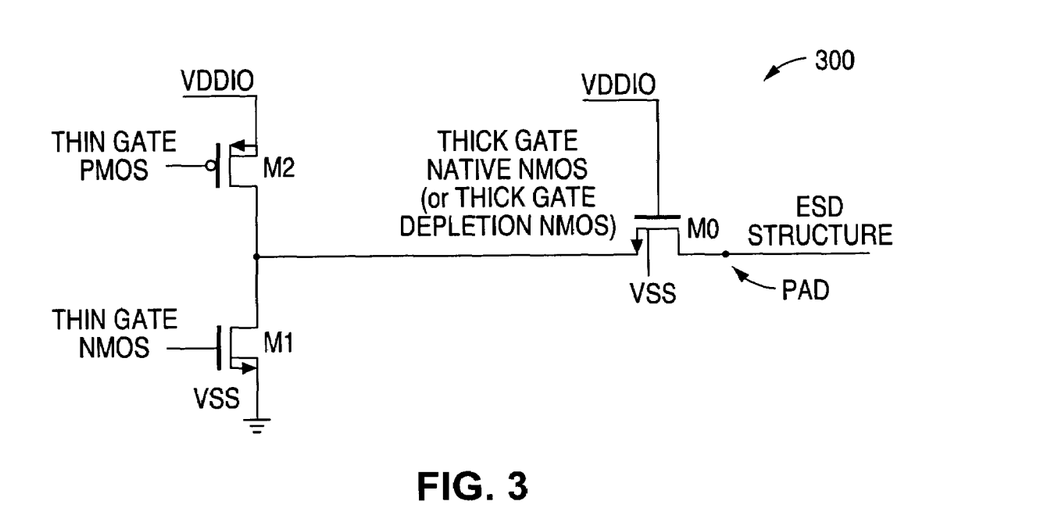
FIG. 3 illustrates a schematic circuit diagram of a first advantageous embodiment of an input/output structure of the present invention.

FIG. 3 illustrates a schematic circuit diagram of a first advantageous embodiment of an input/output structure 300 of the present invention. As shown in FIG. 3, in the input/output structure 300 only one transistor (NMOS transistor M0) touches the PAD node. The PAD node is coupled to an electrostatic discharge (ESD) structure (not shown in FIG. 3). The NMOS transistor M0 is preferably a thick gate native NMOS transistor. A thick gate native NMOS transistor has a typical threshold voltage of approximately a negative one tenth volt (−0.1 V). The thick gate native NMOS transistor M0 comprises a transfer gate of the input/output structure 300.

Alternatively, the NMOS transistor M0 may be a thick gate depletion NMOS transistor. A thick gate depletion NMOS transistor has a typical threshold voltage of approximately a negative three tenths of a volt (−0.35 V). For convenience in description, the NMOS transistor M0 will be referred to as a thick gate native NMOS transistor even though it may alternatively be implemented as a thick gate depletion NMOS transistor.

The NMOS transistor M1 and the PMOS transistor M2 comprise an output driver of the input/output structure 300. The NMOS transistor M1 is preferably a thin gate NMOS transistor. The PMOS transistor M2 is preferably a thin gate PMOS transistor.

The drain of NMOS transistor M0 is connected to the PAD node. The body of NMOS transistor M0 is connected to the ground voltage VSS. The gate of NMOS transistor M0 is connected the external supply voltage VDDIO. The source of NMOS transistor M0 is connected to the drain of PMOS transistor M2 and the to drain of NMOS transistor M1. The source and body of PMOS transistor M2 are connected to the external power supply VDDIO. The source and body of NMOS transistor M1 are connected to the ground voltage VSS. The gate of NMOS transistor M1 and the gate of PMOS transistor M2 are connected to control signals that appropriately turn transistors M1 and M2 on and off.

In order to handle low voltage applications it is preferable that the NMOS transistor M1 and the PMOS transistor M2 be thin gate transistors. A thin gate NMOS transistor has a typical threshold voltage of about thirty five hundredths of a volt (0.35 V). A thin gate PMOS transistor has a typical threshold voltage of about four tenths of a volt (0.40 V). A thick gate NMOS transistor has a typical threshold voltage of about seventy five hundredths of a volt (0.75 V). A thick gate PMOS transistor has a typical threshold voltage of about eight tenths of a volt (0.80 V). At low temperatures the threshold voltages can increase by as much as fifteen hundredths of a volt (0.15 V).

The first advantageous embodiment of an input/output structure 300 shown in FIG. 3 illustrates how a thick gate native NMOS transistor device may be used to provide additional features and capabilities that are not present in a standard PMOS/NMOS input/output transfer gate. The thick gate native NMOS transistor M0 has its gate tied to the external power supply signal VDDIO. This means that as long as the VDDIO signal is valid, the thick gate native NMOS transistor M0 will be on.

One advantage of connecting the gate of the thick gate native NMOS transistor M0 to the external power supply signal VDDIO is that when the VDDIO signal is off (i.e., zero volts (0.0 V)), then the thick gate native NMOS transistor M0 is also off. This means that any voltage that might be applied to the PAD node by another device that is connected to the same bus as the PAD node will not be able to push large amounts of current into the thin gate native PMOS transistor M2. When the thick gate native NMOS transistor M0 is in an off condition, it also prevents any overvoltage that might be on the PAD node from impinging upon the drain of the thin gate NMOS transistor M1 or upon the drain of the thin gate PMOS transistor M2.

The thick gate native NMOS transistor M0 is always on as long as the VDDIO signal is powered up. Then the output signal at the PAD node will just follow the voltage on the drain of the thin gate NMOS transistor M1 and on the drain of the thin gate PMOS transistor M2.

It is seen that the source and drain of the thick gate native NMOS transistor M0 swap as the voltage changes on the drain of the thin gate NMOS transistors M1 and on the drain of the thin gate PMOS transistor M2. Specifically, when transistor M0 is on, the PAD node is actually the source side of the transistor M0. When transistor M1 is on, then the drains of the transistors M1 and M2 are the source side of transistor M0. Note that when transistor M2 is on, if transistor M0 is replaced with a standard thick gate NMOS transistor, then the largest voltage that can be driven onto the PAD node is equal to VDDIO minus the threshold voltage (Vth). For a standard thick gate NMOS transistor this voltage is equal to VDDIO minus seven tenths of a volt (0.7 V).

However, when a thick gate native NMOS transistor is used as transistor M0, then the largest voltage that can be driven onto the PAD node (when transistor M2 is on) is VDDIO minus zero volts. This means that the full VDDIO signal can be driven onto the PAD node. This is a very important result. An example of the increased performance that this feature is capable of providing will be given later in this patent document.

Input/output structure 300 has several advantages. The size of the thick gate native NMOS transistor M0 can be relatively small for a given drive strength. Similarly, the size of the thin gate NMOS transistor M1 and the size of the thin gate PMOS transistor M2 can also be relatively small for a given drive strength.

The thick gate native NMOS transistor M0 provides back-drive/overvoltage and power down protection to the NMOS transistor M1 and the PMOS transistor M2 of the output driver. The thin gate output driver (transistors M1 and M2) followed by a thick gate (native or depletion) NMOS transistor M0 of the present invention works efficiently with no problems down to approximately nine tenths of a volt (0.9 V).

Figure 4:
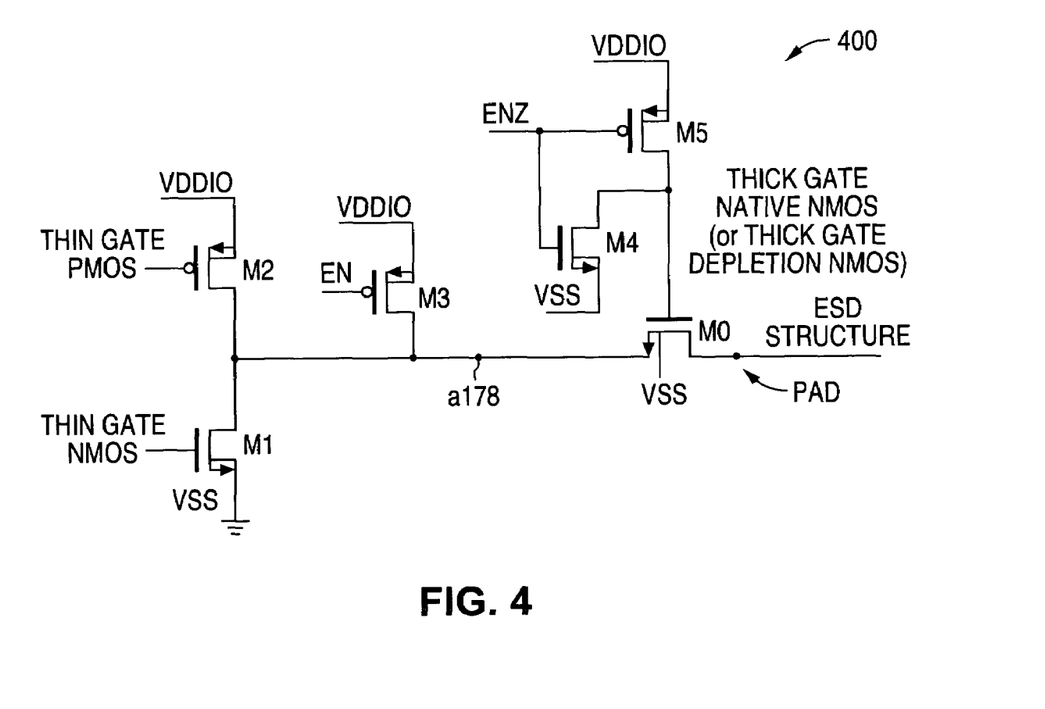
FIG. 4 illustrates a schematic circuit diagram of a second advantageous embodiment of an input/output structure of the present invention.

FIG. 4 illustrates a schematic circuit diagram of a second advantageous embodiment of an input/output structure 400 of the present invention. As shown in FIG. 4, the second input/output structure 400 of the present invention comprises the same features of the first input/output structure 300 of the present invention but has additional features. The additional features comprise thin gate transistors M3, M4 and M5. As will be described more fully below, the additional features provide a pull-up to the source of the NMOS transistor M0 and a control on the gate of the NMOS transistor M0 to help limit current leakage from the PAD node when the input/output structure 400 is inactive.

The gate of NMOS transistor M0 is connected to the drain of NMOS transistor M4 and to the drain of PMOS transistor M5. As shown in FIG. 4, the gate of NMOS transistor M4 and the gate of PMOS transistor M5 are coupled to an inverted version (ENZ) of the enable signal (EN). The source and body of NMOS transistor M4 are connected to the ground voltage VSS and the source and body of the PMOS transistor M5 are connected to the external supply voltage VDDIO.

Transistor M3 is a PMOS transistor that has its gate coupled to then enable signal (EN) and its source and body connected to the external supply voltage VDDIO. The thin gate PMOS transistor M3 is enabled when the enable signal (EN) is low. The use of the enable signal EN will be described more fully below.

The drain of PMOS transistor M3 is connected to the source of NMOS transistor M0 and to the drain of PMOS transistor M2 and to the drain of NMOS transistor M1. The source of the thick gate NMOS transistor M0 is connected to a node that is designated as node "a178". As shown in FIG. 4, the drain of thin gate NMOS transistor M1 and the drain of thin gate PMOS transistor M2 and the drain of thin gate PMOS transistor M3 are also connected to the node "a178".

The voltage on the gate of the NMOS transistor M0 is now controlled by the ENZ signal. Because the ENZ signal is an inverted version of the EN enable signal, when the EN signal is high, then the ENZ signal is low. When the ENZ signal is low, then PMOS transistor M5 puts the VDDIO signal on the gate of the thick gate native NMOS transistor M0 and turns it on.

When the EN signal is high, then PMOS transistor M3 is off. When the EN signal goes low, then PMOS transistor M5 is turned off and NMOS transistor M4 is turned on and ties the gate of transistor M0 to ground and turns transistor M0 off (or as off as possible for a native NMOS device that receives a zero voltage on its gate).

In addition, when the EN signal goes low, the PMOS transistor M3 is turned on and places the VDDIO voltage on node a178. This defeats the ability of the thick gate native NMOS transistor M0 to allow current to enter node a178 from the PAD node when the PAD node is high. As will be described more fully below, this drawback of the input/output structure 400 may be remedied by the use of a different control signal (designated CLP) instead of the enable signal EN to control the operation of transistor M3.

Figure 5:
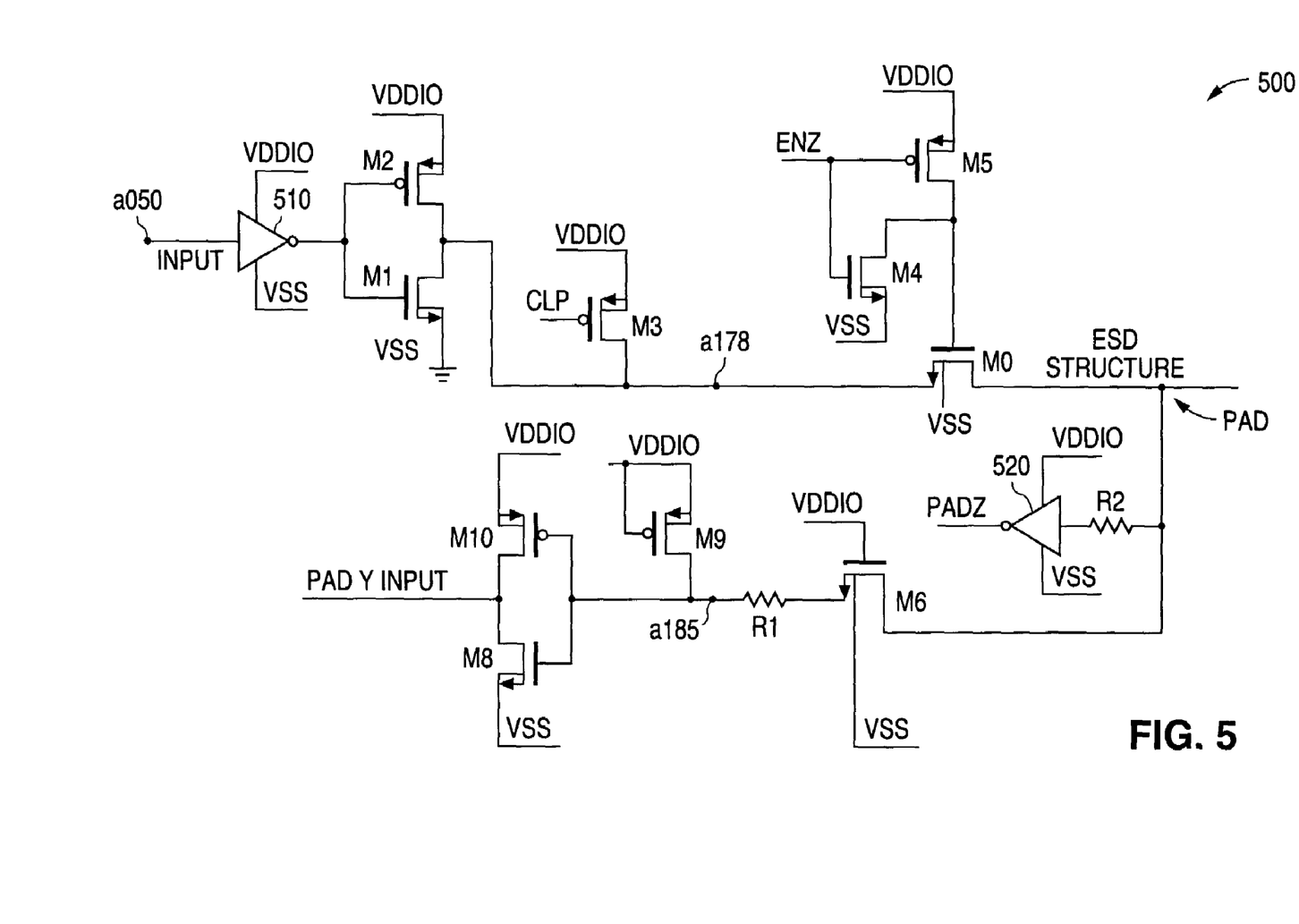
FIG. 5 illustrates a schematic circuit diagram of a third advantageous embodiment of an input/output structure of the present invention.

FIG. 5 illustrates a schematic circuit diagram of a third advantageous embodiment of an input/output structure 500 of the present invention. As shown in FIG. 5, while the third input/output structure 500 of the present invention comprises some of the same features of the second input/output structure 400 of the present invention, it also has additional features. In the input/output structure 500 only two transistors (NMOS transistor M0 and NMOS transistor M6) touch the PAD node. The PAD node is coupled to an electrostatic discharge (ESD) structure (not shown in FIG. 5).

The NMOS transistor M0 and the NMOS transistor MG are preferably both thick gate native NMOS transistors. In an alternate advantageous embodiment of the input/output structure 500, one or both of the NMOS transistor M0 and the NMOS transistor MG may comprise thick gate depletion NMOS transistors. The remaining transistors (M1, M2, M3, M4, M5, M8, M9, M10) are preferably thin gate transistors. The thick gate (native or depletion) NMOS transistors (M0, MG) form the transfer gate of input/output structure 500. As before, for convenience in description, the thick gate NMOS transistors (M0, MG) will be referred to as thick gate native NMOS transistors even though they may alternatively be implemented as thick gate depletion NMOS transistors.

When the thick gate NMOS transistor M0 is active (i.e., in an "on" condition) then the NMOS transistor M1 and the PMOS transistor M2 drive the PAD node. In this case the PAD node acts as an output node for the input/output structure 500. When the thick gate NMOS transistor M0 is not active (i.e., in an "off" condition) then the PAD node acts as an input node for the input/output structure 500. In this case the input at the PAD node passes through the thick gate NMOS transistor M6 and is output to the NMOS transistor M8 and to the PMOS transistor M10 to serve as input to an integrated circuit chip (not shown in FIG. 5) that is connected to the PAD Y INPUT.

It is also possible that the input/output structure 500 can be operated in a "loop back" mode. In a "loop back" mode the NMOS transistor M1 and the PMOS transistor M2 drive the PAD node. While the NMOS transistor M1 and the PMOS transistor M2 are driving the PAD node, the output from the NMOS transistor M8 and the PMOS transistor M10 is also provided to the integrated circuit chip (not shown in FIG. 5) that is connected to the PAD Y INPUT.

The drain of NMOS transistor M0 and the drain of NMOS transistor M6 are both connected to the PAD node. The body of NMOS transistor M0 is connected to the ground voltage VSS. The source of NMOS transistor M0 is connected to the drain of PMOS transistor M2 and the to drain of NMOS transistor M1. The source and body of PMOS transistor M2 are connected to the external power supply VDDIO. The source and body of NMOS transistor M1 are connected to the ground voltage VSS. The gate of NMOS transistor M1 and the gate of PMOS transistor M2 are connected to the output of an inverter circuit 510. The input of inverter circuit 510 is connected to an input node "a050" (designated with the word INPUT in FIG. 5).

The gate of NMOS transistor M0 is connected to the drain of NMOS transistor M4 and to the drain of PMOS transistor M5. As shown in FIG. 4, the gate of NMOS transistor M4 and the gate of PMOS transistor M5 are coupled to an inverted version (ENZ) of the enable signal (EN). The source and body of NMOS transistor M4 are connected to the ground voltage VSS and the source and body of the PMOS transistor M5 are connected to the external supply voltage VDDIO. The input path through transistor M6 is always enabled as long as VDDIO is powered up.

Transistor M3 is a PMOS transistor that has its gate coupled to a clamp signal (CLP) and its source and body connected to the external supply voltage VDDIO. The thin gate PMOS transistor M3 is enabled when the clamp signal (CLP) is low. The generation and use of the clamp signal CLP will be more fully described below.

The drain of PMOS transistor M3 is connected to the source of NMOS transistor M0 and to the drain of PMOS transistor M2 and to the drain of NMOS transistor M1. The source of the thick gate NMOS transistor M0 is connected to a node that is designated as node "a178". As shown in FIG. 5, the drain of thin gate NMOS transistor M1 and the drain of thin gate PMOS transistor M2 and the drain of thin gate PMOS transistor M3 are also connected to the node "a178".

The input/output structure 500 of the present invention also comprises thin gate transistors M8, M9 and M10. The drain of NMOS transistor M8 and the drain of PMOS transistor M10 are connected together at an output node (designated with the word PAD Y INPUT in FIG. 5). The source and body of PMOS transistor M10 are connected to the external power supply voltage VDDIO. The source and body of the NMOS transistor M8 are connected to the ground voltage VSS. The gate of the NMOS transistor M8 and the gate of the PMOS transistor M10 are both connected to a first end of resistor R1. The second end of transistor R1 is connected to the source of thick gate NMOS transistor M6. The first end of resistor R1 is designated as node "a185". It is noted that the resistor R1 can be placed on either side of the thick gate NMOS transistor M6. The function of resistor R1 is to provide ESD enhancement and current limitation.

The drain of PMOS transistor M9 is connected to the first end of the resistor R1 (and to the gate of NMOS transistor M8 and to the gate of PMOS transistor M10). The source, gate and body of PMOS transistor M9 are connected to the external supply voltage VDDIO. PMOS transistor M9 is used to provide a path from node a185 to the external power supply voltage VDDIO to bleed off charge on node a185 if overvoltage leakage passes through thick gate NMOS transistor M6. The resistance value of resistor R1 can be sized to help reduce the amount of overvoltage leakage.

The gate of thick gate NMOS transistor M6 is connected to the external supply voltage VDDIO and the body of thick gate NMOS transistor M6 is connected to the ground voltage VSS. The drain of the thick gate NMOS transistor M6 is connected to the PAD node.

An input of a thick gate inverter 520 is also connected to the PAD node through a resistor R2. The thick gate inverter 520 produces an inverted signal (designated PADZ) that represents an inverted value of the voltage signal that appears at the PAD node. The inverted signal PADZ is used in the circuit 600 (described below) to generate the clamp signal CPL for PMOS transistor M3.

Figure 6:
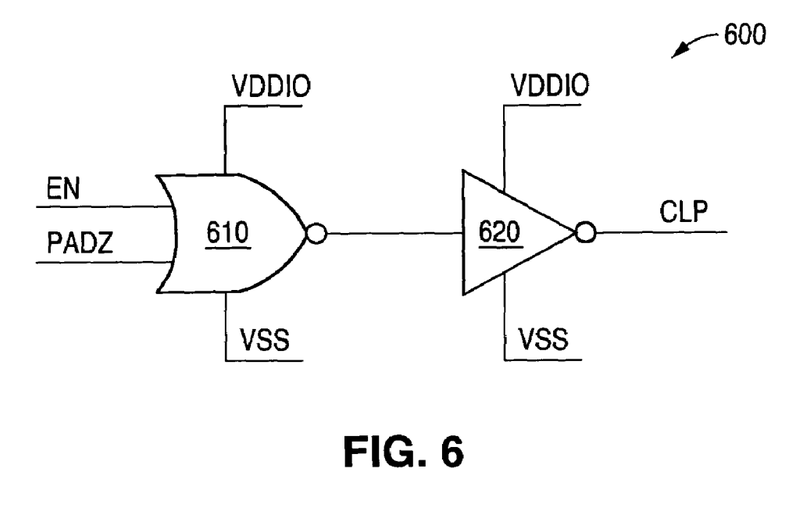
FIG. 6 illustrates a schematic circuit diagram of a circuit for generating a clamp signal for use with the advantageous embodiment of an input/output structure of the present invention.

FIG. 6 illustrates a schematic circuit diagram of a circuit 600 for generating the clamp signal CLP for use with the advantageous embodiment of the input/output structure 500 of the present invention. Circuit 600 comprises a NOR circuit 610 and an inverter circuit 620. The NOR circuit 610 receives the enable signal EN on a first input and receives the inverted PAD signal (i.e., the PADZ signal) on a second input. The output of the NOR circuit 610 is connected to inverter 620. The output of the inverter circuit 620 is the clamp signal CLP.

The circuit 600 generates the clamp signal CLP. The clamp signal CLP is "on" when it is "low." The clamp signal CLP is "low" only when the enable signal EN is "low" and the PAD signal is "high." That is, the clamp signal CLP is "on" only when the enable signal EN is "low" and the inverted PAD signal (PADZ) is "low."

Assume that the value of the external supply voltage VDDIO is on the low end of the VDDIO range while the PAD node is being driven high by a value on the high end of the VDDIO range. Then the input/output structure 500 of the present invention will prevent current leakage on the PAD node by taking the gate of the thick gate NMOS transistor M6 to zero.

The CLP signal enables transistor M3 if the output path is disabled and the PAD node is taken high by some external driver. Turning on transistor M3 prevents transistor M0 from coming on and pushing a current through transistor M0. Because transistor M3 is off when the voltage on the PAD node is low, transistor M3 is prevented from potentially pushing current through transistor M0 to the PAD node when the voltage on the PAD node is low and the output driver is disabled (i.e., when the EN signal is "low").

It should be noted that a thick gate depletion NMOS transistor could be used instead of a thick gate native NMOS transistor. Most processes can produce thick gate native NMOS transistors with no extra mask steps or processing, while producing a thick gate depletion NMOS transistor requires an extra mask step and processing steps.

The input/output structure 500 of the present invention uses native NMOS thick gate devices (transistor M0, transistor M6, inverter 520) in conjunction with thin gate input drivers and thin gate output drivers. The control on thick gate NMOS transistor M0 keeps input leakage current to a minimum. The thin gate PMOS transistor M3 and the thin gate PMOS transistor M9 may not be required but are provided as safeguard circuits.

The input/output structure 500 enables existing ESD protection methods to provide a reasonable level of ESD performance. If thin gate transistors were allowed to touch the PAD node then it would be very difficult to obtain a reasonable level of ESD performance. The ESD protection methods that presently exist would not work. The input/output structure 500 also provides a good alternating current (ac) performance and minimal input leakage current. The input/output structure 500 also provides a reasonable level of voltage blocking capability. If a five volt (5.0 V) signal is placed on the PAD node, then the voltage on node a178 is approximately two volts (2.0 V) and the voltage on node a185 is approximately two and three tenths volts (2.3 V).

Figure 7:
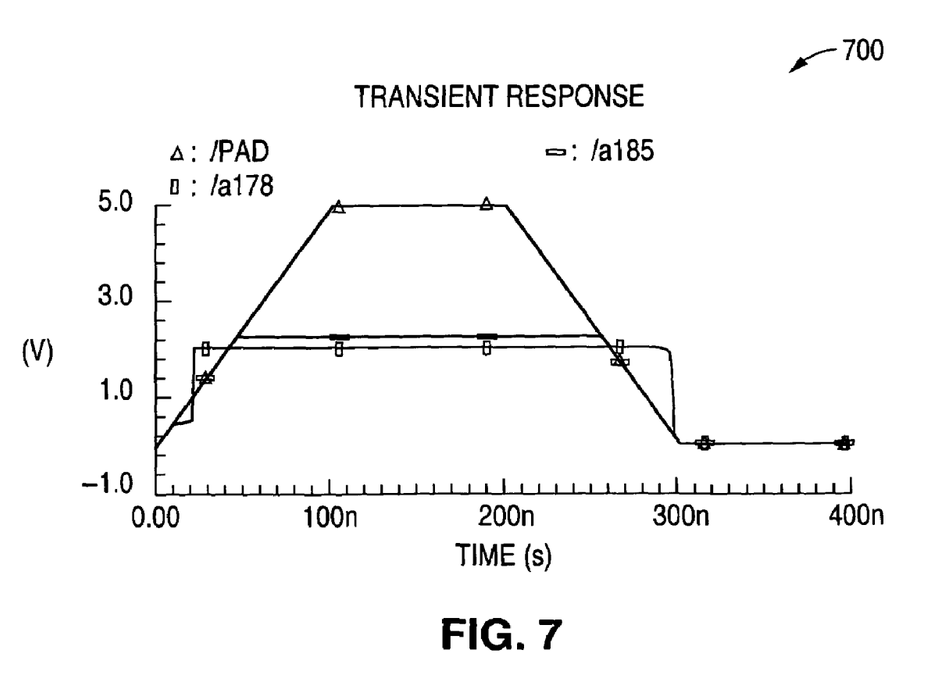
FIG. 7 illustrates a diagram showing an exemplary operation of the output driver of the input/output structure of the present invention.

FIG. 7 illustrates a diagram 700 showing an exemplary operation of the output driver of the input/output structure 500 of the invention. As the voltage signal on the PAD node increases up to approximately five volts (5.0 V), the voltage signal on the node a178 levels off at approximately two volts (2.0 V). As the voltage signal on the PAD node increases up to approximately five volts (5.0 V), the voltage signal on the node a185 levels off at approximately two and three tenths volts (2.3 V).

Figure 8:
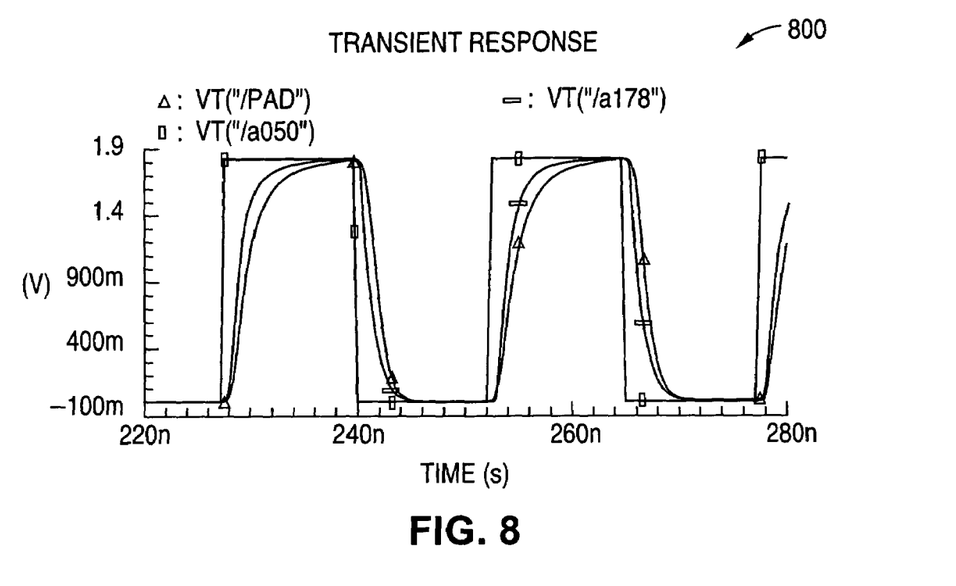
FIG. 8 illustrates a diagram showing an exemplary operation of the output driver of the input/output structure of the present invention.

FIG. 8 illustrates a diagram 800 showing an exemplary operation of the output driver of the input/output structure 500 of the invention. An inverter circuit 510 has been placed in front of NMOS transistor M1 and PMOS transistor M2. As previously mentioned, the input node to the inverter circuit 510 has been designated as node a050. The inverter circuit 510 is provided so that the input voltage signal at node a050 can be shown in FIG. 8 adjacent to the voltage signal at node a178 and adjacent to the voltage signal at the PAD node. As shown in FIG. 8, the response of the voltage signal at node a178 is very close to the response of the voltage signal at the PAD node.

Figure 9:
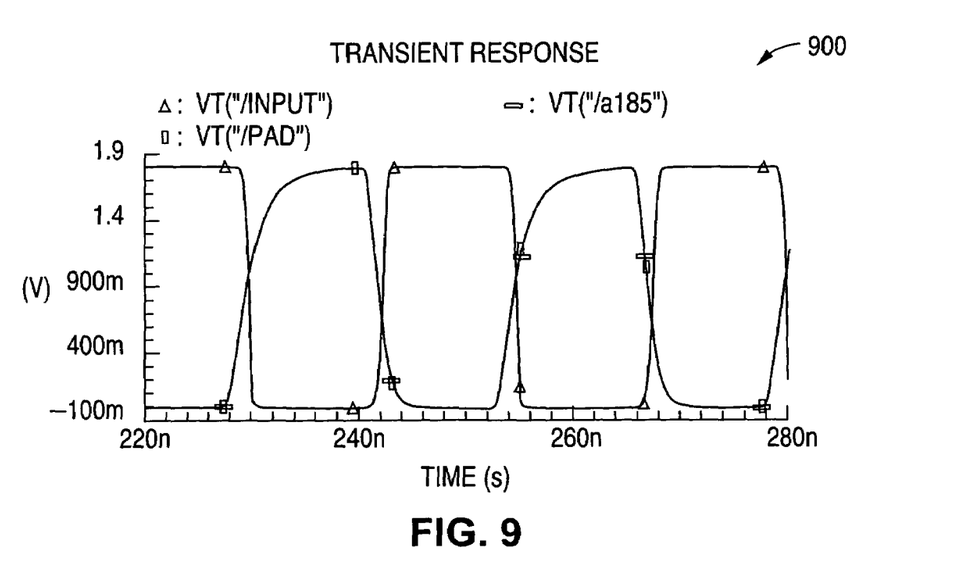
FIG. 9 illustrates a diagram showing an exemplary operation of the input buffer of the input/output structure of the present invention.

FIG. 9 illustrates a diagram 800 showing an exemplary operation of the input buffer of the input/output structure 500 of the invention. The voltage signal designated VT("/IN-PUT") in FIG. 9 corresponds to a voltage signal on the output line designated "PADY INPUT" in FIG. 5. As shown in FIG. 9, the response of the voltage signal at node 185 is extremely close to the response of the voltage signal at the PAD node.

Figure 10:
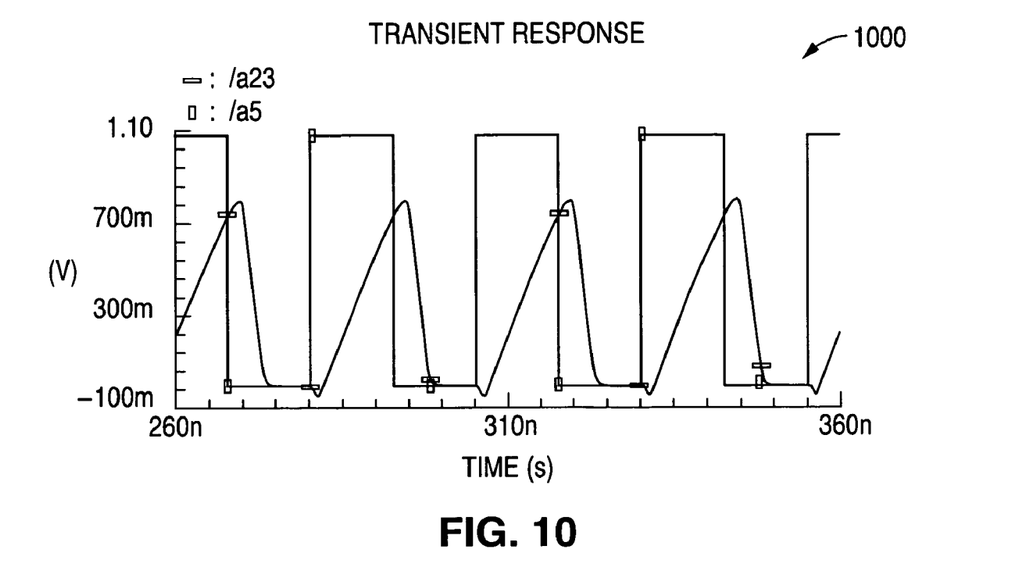
FIG. 10 illustrates a diagram showing an exemplary operation of the first prior art input/output structure shown in FIG. 1.

FIG. 10 illustrates a diagram 1000 showing an exemplary operation of the prior art input/output structure 100. Assume that the external supply voltage VDDIO for input/output structure 100 is one and two tenths volts (1.2 V) plus or minus ten percent (+/−10%). A simulation was performed for the prior art input/output structure 100 operating at forty mega-Hertz (40 MHz) and at a temperature of minus forty degrees Celsius (−40° C.). The input voltage signal (a square wave) is provided at the input node "a5". The resulting output voltage signal at the PAD node (node "a23") is shown to be quite unacceptable. The total output driver size in input/output structure 100 is approximately three thousand seven hundred and twenty microns (3,720 μm).

Figure 11:
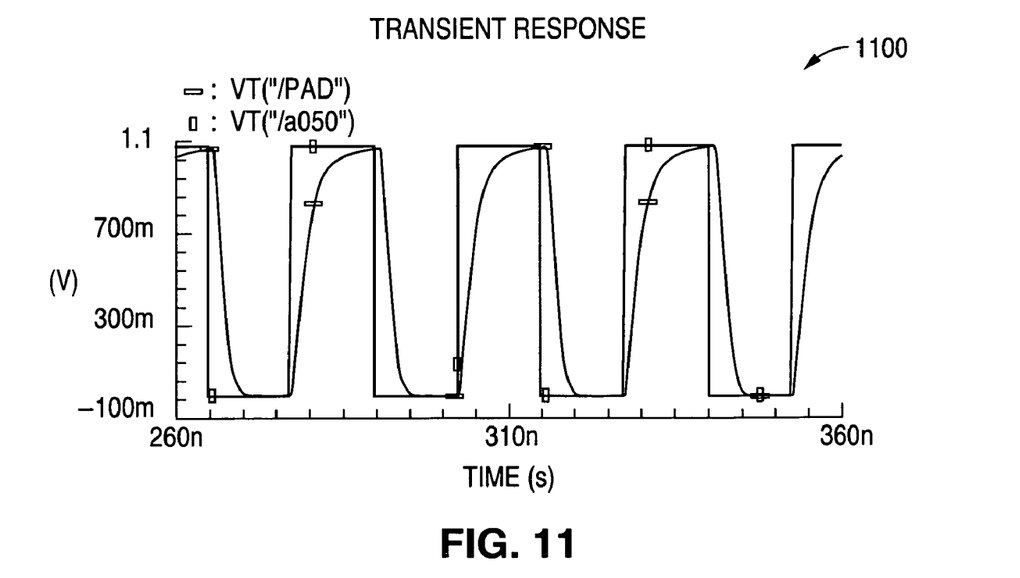
FIG. 11 illustrates a diagram showing an exemplary operation of the input/output structure of the present invention under the same operating conditions as the first prior art input/output structure shown in FIG. 1 to provide a comparison with the results shown in FIG. 10.

FIG. 11 illustrates a diagram 1100 showing a comparable operation of the input/output structure 500 of the present invention under the same conditions as the simulation that generated the results shown in FIG. 10. The input voltage signal (a square wave) is provided at the input node "a050". The resulting output voltage signal at the PAD node shows a much better response. By way of further comparison, the total output driver size in the input/output structure 500 of the present invention is approximately three hundred and ninety microns (390 μm). This represents a total output driver size that is only about ten percent (10%) of that of the prior art input/output structure 100.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. An integrated circuit input/output structure that comprises:
    a transfer gate that comprises at least one thick gate native n-channel metal oxide semiconductor (NMOS) transistor; and
    an input or output driver that comprises:
        a thin gate NMOS transistor coupled to the at least one thick gate native NMOS transistor; and
        a thin gate p-channel metal oxide semiconductor (PMOS) transistor coupled to the at least one thick gate native NMOS transistor.

2. The input/output structure as claimed in claim 1, wherein the at least one thick gate native NMOS transistor is configured to provide to the integrated circuit input/output structure at least one of: overvoltage protection, backdrive protection, and power down protection.

3. The input/output structure as claimed in claim 1, wherein a gate of the at least one thick gate native NMOS transistor is connected to a power supply.

4. The input/output structure as claimed in claim 1, wherein each of the thin gate transistors has a gate thickness of about seventy Ångstroms, and each of the at least one thick gate native NMOS transistor has a gate thickness of about one hundred thirty Ångstroms.

5. The input/output structure as claimed in claim 1, wherein the at least one thick gate native NMOS transistor comprises a first thick gate native NMOS transistor coupled to an input driver and a second thick gate native NMOS transistor coupled to an output driver.

6. The input/output structure as claimed in claim 1 further comprising a pull up circuit coupled to a source of the at least one thick gate native NMOS transistor.

7. The input/output structure as claimed in claim 1, further comprising a control circuit coupled to a gate of the at least one thick gate native NMOS transistor.

8. An integrated circuit input/output structure that comprises:
    a transfer gate that comprises at least one thick gate depletion n-channel metal oxide semiconductor (NMOS) transistor; and
    an input or output driver that comprises:
        a thin gate NMOS transistor coupled to the at least one thick gate depletion NMOS transistor; and
        a thin gate p-channel metal oxide semiconductor (PMOS) transistor coupled to the at least one thick gate depletion NMOS transistor.

9. The input/output structure as claimed in claim 8, wherein the at least one thick gate depletion NMOS transistor is configured to provide to the integrated circuit input/output structure at least one of: overvoltage protection, backdrive protection, and power down protection.

10. The input/output structure as claimed in claim 8, wherein a gate of the at least one thick gate depletion NMOS transistor is connected to a power supply.

11. The input/output structure as claimed in claim 8, wherein each of the thin gate transistors has a gate thickness of about seventy Ångstroms, and each of the at least one thick gate depletion NMOS transistor has a gate thickness of about one hundred thirty Ångstroms.

12. The input/output structure as claimed in claim 8, wherein the at least one thick gate depletion NMOS transistor comprises a first thick gate depletion NMOS transistor coupled to an input driver and a second thick gate depletion NMOS transistor coupled to an output driver.

13. The input/output structure as claimed in claim 8, further comprising a pull up circuit coupled to a source of the at least one thick gate depletion NMOS transistor.

14. The input/output structure as claimed in claim 8 further comprising a control circuit coupled to a gate of the at least one thick gate depletion NMOS transistor.

15. An integrated circuit input/output structure that comprises:
   a transfer gate that comprises:
      a first thick gate native n-channel metal oxide semiconductor (NMOS) transistor coupled to an input/output pad of the input/output structure; and
      a second thick gate native NMOS transistor coupled to the input/output pad of the input/output structure; and
   at least one of an input driver and an output driver that comprises:
      a first thin gate NMOS transistor coupled to the first thick gate native NMOS transistor; and
      a first thin gate p-channel metal oxide semiconductor (PMOS) transistor coupled to the first thick gate native NMOS transistor.

16. The input/output structure as claimed in claim 15, wherein the first and second thick gate native NMOS transistors are configured to provide to the integrated circuit input/output structure at least one of: overvoltage protection, backdrive protection, and power down protection.

17. The input/output structure as claimed in claim 15, wherein a gate of the first thick gate native NMOS transistor is connected to a power supply, and a gate of the second thick gate native NMOS transistor is connected to the power supply.

18. The input/output structure as claimed in claim 15, wherein the first thin gate NMOS transistor and the first thin gate PMOS transistor comprise an input driver, and further comprising an output driver that comprises:
   a second thin gate NMOS transistor that is coupled to the second thick gate native NMOS transistor; and
   a second thin gate PMOS transistor that is coupled to the second thick gate native NMOS transistor.

19. The input/output structure as claimed in claim 15, further comprising a control circuit that is coupled to a gate of the first thick gate depletion NMOS transistor.

20. The input/output structure as claimed in claim 15, further comprising:
   a first pull up circuit coupled to a source of the first thick gate native NMOS transistor; and
   a second pull up circuit coupled to a source of the second thick gate native NMOS transistor.

21. The input/output structure as claimed in claim 20, further comprising a NOR gate having a first input configured to receive an enable signal and having a second input;
   a thick gate inverter circuit having an input coupled to the input/output pad of the input/output structure and having an output connected to the second input of the NOR gate; and
   a thin gate inverter circuit having an input coupled to an output of the NOR gate, the output of the thin gate inverter configured to provide a control signal for the first pull up circuit.

* * * * *

UNITED STATES PATENT AND TRADEMARK OFFICE
CERTIFICATE OF CORRECTION

PATENT NO.      : 7,642,600 B1
APPLICATION NO. : 11/635321
DATED           : January 5, 2010
INVENTOR(S)     : Joseph D. Wert It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 516 days.

Signed and Sealed this

Twenty-first Day of December, 2010

David J. Kappos
*Director of the United States Patent and Trademark Office*